United States Patent [19]
Black et al.

[11] Patent Number: 6,069,381
[45] Date of Patent: May 30, 2000

[54] FERROELECTRIC MEMORY TRANSISTOR WITH RESISTIVELY COUPLED FLOATING GATE

[75] Inventors: Charles Thomas Black, White Plains, N.Y.; Jeffrey John Welser, Stamford, Conn.

[73] Assignee: International Business Machines Corporation, Armonk, N.Y.

[21] Appl. No.: 08/929,878

[22] Filed: Sep. 15, 1997

[51] Int. Cl.[7] ............................. H01L 29/76; H01L 29/88; H01L 29/92; H01L 29/94
[52] U.S. Cl. ......................... 257/316; 257/314; 257/315; 257/324; 257/379; 257/380
[58] Field of Search ........................... 257/295, 314–324, 257/379–380; 365/185.17–28, 222–228; 438/257–264

[56] References Cited

U.S. PATENT DOCUMENTS

| | | | |
|---|---|---|---|
| 4,888,630 | 12/1989 | Paterson | 365/228 |
| 5,365,094 | 11/1994 | Takasu . | |
| 5,511,020 | 4/1996 | Hu et al. | 365/185.28 |
| 5,523,964 | 6/1996 | McMillan et al. | 257/295 |
| 5,640,345 | 6/1997 | Okuda et al. | 257/324 |

FOREIGN PATENT DOCUMENTS

| | | | |
|---|---|---|---|
| 405335590 | 12/1993 | Japan | 257/295 |
| 406151762 | 5/1994 | Japan | 257/295 |

OTHER PUBLICATIONS

F.Y. Chen et al., "A Nonvolatile Ferroelectric Memory Device with a Floating Gate" Appl. Phys. Lett. 69(21), Nov. 18, 1996, p. 3275–6.

J. Yu et al., "Formation and Characteristics of Pb(Zr,Ti)O3 Field–Effect Transistor with a SiO2 Buffer Layer" Appl. Phys. Lett. 70(4), Jan. 27, 1997 p. 490–2.

T. Nakamura et al., "WP 4.3: A Single–Transistor Ferroelectric Memory Cell", 1995 IEEE International Solid–State Circuits Conference, p. 689.

T. Rost et al., "Ferroelectric Switching of a Field–Effect Transistor with a Lithium Niobate Gate Insulator", Appl. Phys. Lett., vol. 59, No. 27, Dec. 30, 1991, p. 3654–6.

T. Hirai et al., "Formation of Metal/Ferroelectric/Insulator/Semiconductor Structure with a CeO2 Buffer Layer", Jpn.J.Appl.Phys. vol.33 (1994) p.5219–5222, Part 1, No. 9B, Sep. 1994.

E. Tokumitsu, et al., "Nonvolatile Memory Operations of Metal–Ferroelectric–Insulator–Semiconductor (MFIS) Fet's . . . " IEEE Electron Device Letters, vol.18,No. 4, Apr. 1997p.160–2.

K. Sugibuchi, et al., "Ferroelectric Field–Effect Memory Device Using Bi4Ti3012 Film" Journal of Applied Physics, vol. 46, No. 7, Jul. 1975, p. 2877–2881.

*Primary Examiner*—Minh Loan Tran
*Assistant Examiner*—Cuong Quang Nguyen
*Attorney, Agent, or Firm*—McGinn & Gibb, P.C.

[57] ABSTRACT

The present invention proposes a new type of single-transistor memory device, which stores information using the polarization of a ferroelectric material. The device is a floating-gate FET, with a ferroelectric material positioned between the gate and the floating gate, and a resistance, preferably in the form of a thin $SiO_2$ dielectric between the floating gate and the transistor channel. Unlike previous designs, in this device the floating gate is both capacitively and resistively coupled to the transistor channel, which enables the device to be both read and written using low voltages. This device offers significant advantages for operation at low voltages and at high speeds, for repeated cycling of over $10^{10}$ times, since device durability is limited by the ferroelectric endurance rather than oxide breakdown, and for integration at gigabit densities.

11 Claims, 5 Drawing Sheets

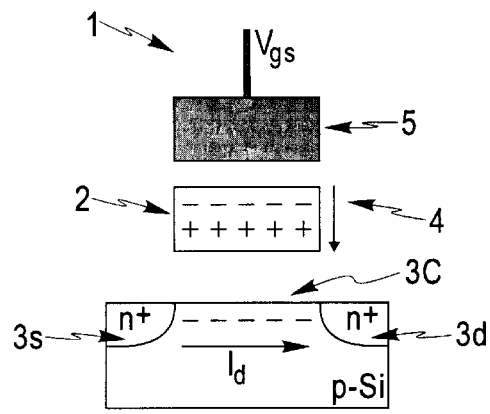
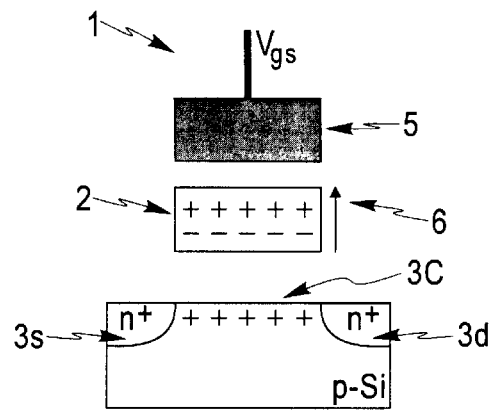
Fig. 1a                Fig. 1b
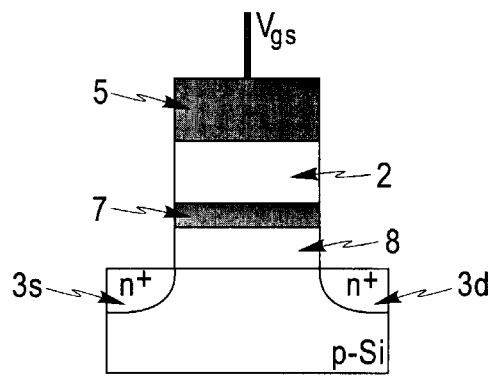
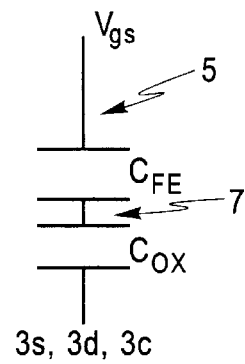
Fig. 2a                Fig. 2b

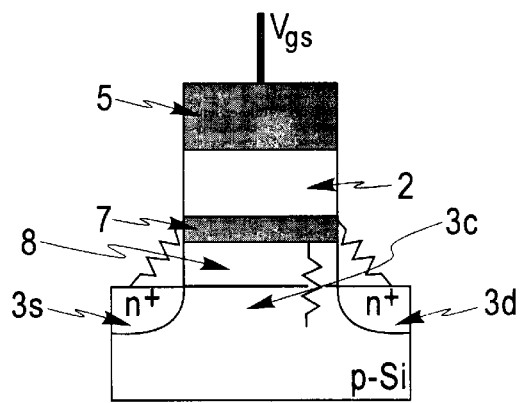
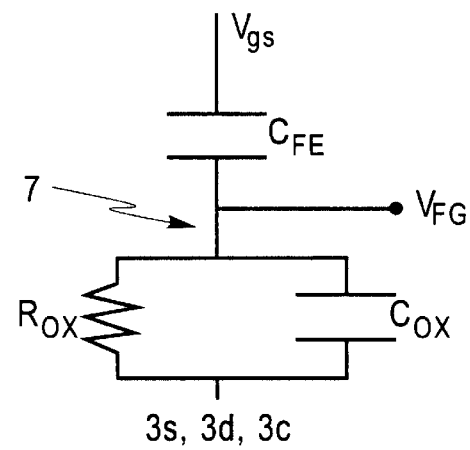
Fig. 3a              Fig. 3b
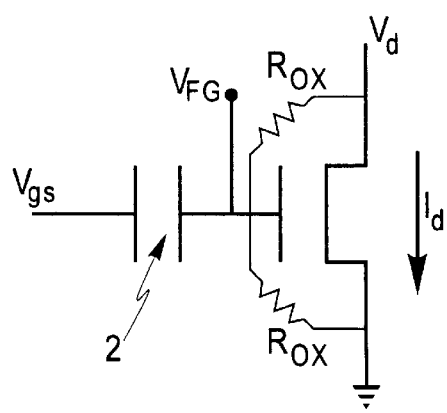
Fig. 4

FERROELECTRIC MEMORY TRANSISTOR WITH RESISTIVELY COUPLED FLOATING GATE

FIELD OF THE INVENTION

This invention relates to microelectronics, and in particular to field effect transistors (FET's) that have a source, a drain, a channel therebetween, a floating gate over the channel, a ferroelectric material over the floating gate and a gate electrode over the ferroelectric material. This novel FET has particular application in high speed, high density computer memories.

BACKGROUND OF THE INVENTION

While FET's have uses throughout the microelectronics field, a major application is in memory cells for storage of data. According to standard industry practice, memory cells are currently formed in semiconductor materials such as silicon by a combination of an FET transistor and a capacitor which may, for example, be deep-etched into the silicon nearby and can store electric charge. While such memory cells, when combined to form DRAM's (Dynamic Random Access Memory) and SRAM's (Static Random Access Memory), now dominate fast-access data storage in computer systems, they have a major drawback—they lose all their information when the power is removed. As a result, there has been a very strong interest in creating nonvolatile memory for low power applications. As is well known, FET's are also used in EEPROM, Flash memory and other non-volatile memory applications.

Single-transistor memory cells using ferroelectric materials were first proposed in the 1960's and have been pursued since the early 1970's. These materials provide a means for nonvolatile information storage because of the inherent stability of the two ferroelectric polarization states. It is thought that the polarization charge of a ferroelectric material could be used to change the surface conductivity of a semiconductor material. In effect, such ferroelectric FET's would store information using the polarization direction, rather than using an excess electron charge on a capacitor or a floating gate—the current industry standard for memory cells. Because of their non volatility and their fast switching speeds (<1 ns), ferroelectrics have become attractive candidates for future generations of DRAM. Recently, several designs for ferroelectric memory transistors have been proposed that have significant shortcomings which limit their effectiveness for low-voltage, high-speed, high-density (i.e. DRAM-like) memory applications.

FIG. 1 (prior art) illustrates the operating principle of a ferroelectric memory transistor. The device 1 is essentially a MOSFET with a piece of ferroelectric material 2 positioned somewhere above the Si channel 3c between source 3s and drain 3d. When the ferroelectric is polarized in one direction 4 ("downward" as depicted in FIG. 1(a)), a read voltage $V_{gs}$ applied to the gate 5 induces an inversion layer in the transistor channel. If a voltage bias is placed across the source-drain, a current will flow through the transistor. A different case is shown in prior art FIG. 1(b), where the ferroelectric is polarized in the opposite direction 6. Because the ferroelectric is polarized differently, the same read voltage $V_{gs}$ applied to the gate does not induce an inversion layer for conduction in the channel 3c, and so little current flows. The threshold voltage of the transistor is thus controlled via the direction of ferroelectric polarization. An attractive feature of this type of device is that information is stored in the polarization state of the ferroelectric, and so the information remains undisturbed when power is removed from the device.

Attempts to reduce this principle to practice have followed two main avenues. In the first design, the ferroelectric material is either placed directly on the Si transistor channel (as described in Rost et al, in Appl. Phys. Lett. 59, 3654, 1991 and in Sugubuchi et al., in J. Appl. Phys. 46, 2877, 1975), or alternatively on a dielectric layer which itself covers the channel (for example, see Chen et al in Appl. Phys. Lett. 69, 3275, 1996, Tokumitsu et al in IEEE Electron Device Letters 18, 160, 1997, Yu et al at Appl. Phys. Lett. 70, 490, 1997, and Hirai et al at Jpn. J. Appl. Phys. 33, 5219, 1994). This device geometry results in a strong electrostatic coupling between the top gate and the channel. Although this device design has several attractive features, it suffers severe fabrication difficulties, including diffusion of the ferroelectric into the Si channel, and uncontrolled formation of thin $SiO_2$ layers at the Si/ferroelectric interface during thermal treatments. As a result of problems introduced by these fabrication issues, devices of this type have shown slow switching speeds (see Tokumitsu et al, supra, and Sugibuchi et al, supra), high operating voltages (see Chen et al supra, Tokumitsu et al, supra, Rost et al, supra, and Sugibuchi et al, supra), and poor memory retention characteristics (see Yu et al, supra, and Hirai et al, supra).

FIG. 2 (prior art) shows a second (and more promising) design of a ferroelectric FET for use in memory applications, as described in Chen et al, supra, Nakamura et al at IEDM, 68, 1995, and in U.S. Pat. No. 5,365,094, issued Nov. 15, 1994 to H. Takasu). In this device, an electrically conducting (e.g. metal) floating gate 7 is inserted between the ferroelectric film 2 and a bottom gate insulator 8 (which is typically $SiO_2$). From a fabrication standpoint, this device is attractive because the ferroelectric is separated from the Si channel by both the floating gate and a $SiO_2$ layer. A suitable floating gate material (e.g. Pt or Ir) can be used to prevent diffusion of the ferroelectric material into the channel.

A main drawback of this type of structure is the high voltage required for changing the polarization of the ferroelectric. By adding the $SiO_2$ and floating gate layers to the gate stack, the ferroelectric becomes much more weakly coupled to the Si channel. For a given voltage applied to the gate only a fraction of $V_{gs}$ is applied across the ferroelectric (and thus only a fraction of the applied voltage is available for writing the cell). Ferroelectric materials have large dielectric constants (typically between about 100–500) compared to $SiO_2$ (about 3.9), which means that to sustain a reasonable voltage across the ferroelectric, a significantly higher voltage must be applied to the gate. In general the voltage required to write information to this device is much larger than that necessary for reading. All devices of this type built to date use operating voltages in excess of 5 V (see Chen et al, supra, and U.S. Pat. No. 5,365,094), while for high-density memory applications, the maximum operating voltages should be less than 3V.

One interesting proposal has been to use a high-dielectric constant material (such as barium strontium titanate) in place of the $SiO_2$ layer 8, to more closely match the dielectric constants of the two insulators in the gate stack (see Tokumitsu et al, supra, and U.S. Pat. No. 5,365,094). This would enable a the memory device to function at lower voltages, although it introduces problems in fabrication similar to those discussed above with regard to the first type of ferroelectric FET design. Even with more closely matched dielectrics however, it is still impossible to use the entire gate voltage $V_{gs}$ for writing the memory cell.

SUMMARY OF THE INVENTION

The present invention therefore provides a field effect transistor comprising a source region and a drain region formed in a semiconductor material, a channel region disposed between said source region and said drain region, an insulating layer of electrically insulating material disposed over said channel region, a floating gate layer of electrically conducting material disposed over said insulating layer, a layer of electrically nonconducting ferroelectric material disposed over said floating gate layer, a gate electrode overlying said layer of ferroelectric material, and an electrical resistor for resistively coupling said floating gate layer to at least one of said source region, drain region, and channel region.

According to a preferred embodiment of the invention, the aforesaid electrical resistor comprises the aforesaid insulating layer, which is disposed between the channel region and the floating gate layer; to serve as an electrical resistor, the aforesaid layer of insulator is made sufficiently thin to exhibit electrical resistance by acting as a quantum-mechanical tunnel barrier, permitting electron tunnelling through said layer. For example, the semiconductor material can be silicon and the aforesaid insulating material is preferably $SiO_2$.

When a voltage is applied to the aforesaid gate electrode, then the source region and the drain region are at an initial first potential and the aforesaid floating gate layer is at an initial second potential. Due to the resistive coupling, the potential of the floating gate will approach that of the source/drain region. The amount of time required, as measured by a "characteristic time" defined to be the time required for said floating gate layer to change its potential from said initial second potential to a value halfway between said first potential and said initial second potential, can be varied by the amount of resistance, and will be determined by the desired application. If the FET is to be used as an EEPROM device, the time should be less than about 1 second.

For use in Flash memory devices, it is preferable that the characteristic time be less than about 1 millisecond.

For use in DRAM memory devices, it is preferable to select the characteristic time to be is less than about 100 nanoseconds, and desirably less than 10 nanoseconds.

Preferably, for DRAM applications, the layer of $SiO_2$ should have a thickness of no more than 40 Angstroms, or even 15 Angstroms, in order to permit direct quantum-mechanical electron tunnelling as aforesaid.

According to another preferred embodiment, the aforesaid transistor may have a fabricated resistor coupled to at least one member of the group consisting of said source region, said drain region, and said channel region. Preferably, the fabricated resistor is composed of doped polysilicon and coupled to at least one member of the group consisting of said source region, said drain region, and said channel region.

The ferroelectric layer itself may be composed of any available ferroelectric material, including, for example, $LiNbO_3$, $BaTiO_3$, $PbTiO_3$, $Bi_3Ti_4O_{12}$, $SrBi_2TaO_9$, $SrBi_2Ta_xNb_{1-x}O_9$, and $PbZr_xTi_{1-x}O_3$.

BRIEF DESCRIPTION OF THE DRAWINGS

The present invention will be understood more fully with reference to the detailed description herein, when taken together with the accompanying drawings, wherein:

FIGS. 1a and 1b illustrate the operating principles of a ferroelectric transistor in accordance with the prior art.

FIG. 2 is a crossectional view of a prior art ferroelectric FET transistor with a floating gate, along with a corresponding schematic circuit diagram thereof.

FIG. 3 is a crossectional view of a ferroelectric FET transistor in accordance with the present invention, along with a corresponding schematic circuit diagram thereof.

FIG. 4 is a schematic circuit diagram of a memory cell utilizing an FET transistor in accordance with the present invention.

DETAILED DESCRIPTION OF THE INVENTION

Figure 5:
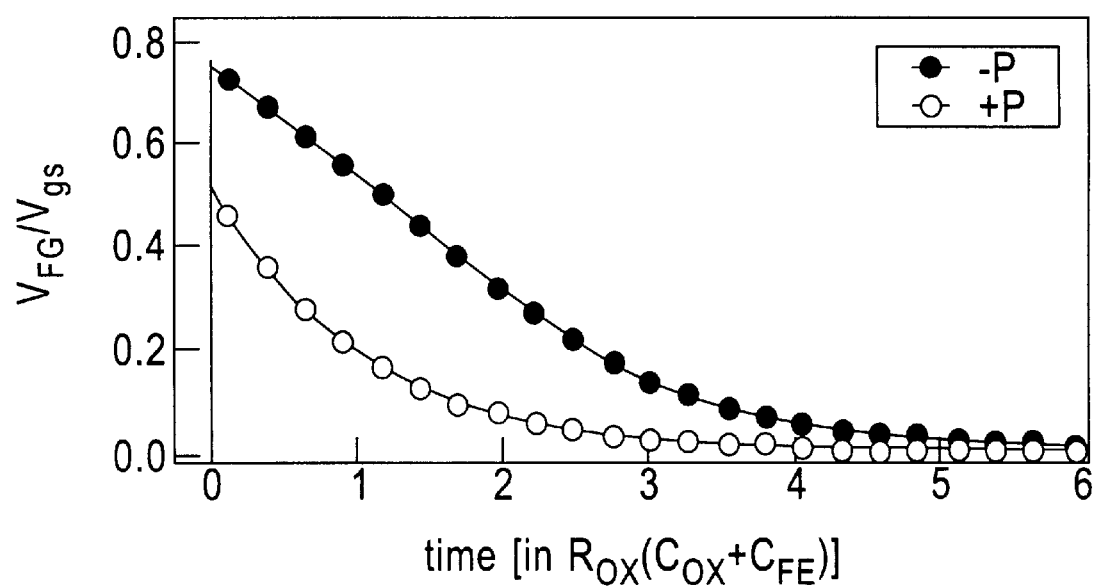
FIG. 5 is graph that illustrates the relationship of the floating gate voltage with time elapsed after the gate voltage is applied, for both a positive and a negative polarization of the ferroelectric layer in a FET transistor according to the present invention.

FIG. 3 illustrates the ferroelectric memory transistor according to the present invention, in partly schematic form. In contrast to the designs discussed previously, the floating gate of this device is both capacitively and resistively coupled to the Si channel. Different ways for accomplishing this will be described hereinafter. As will be shown, this transistor is both readable and writable at high speeds and with low voltages.

When a voltage $V_{gs}$ is applied to the gate 5 of this device, $V_{gs}$ is initially divided between the ferroelectric capacitor and the oxide capacitor, so that the floating gate potential $V_{FG}$ is raised to a fraction of the total applied voltage:

$$V_{FG}=(C_{FE}V_{gs}+\Delta P)/(C_{FE}+C_{OX})$$

where $C_{FE}$ and $C_{OX}$ are the capacitances of the ferroelectric and oxide capacitors respectively, $V_{gs}$ is the voltage applied to the gate, and $\Delta P$ is the change in ferroelectric polarization on applying the voltage to the gate. The voltage across the ferroelectric is:

$$V_{FE}=V_{gs}-V_{FG}=(C_{OX}V_{gs}-\Delta P)/(C_{FE}+C_{OX})$$

Because of the resistive coupling between floating gate 7 and channel 3c (denoted by a resistance $R_{OX}$), the floating gate potential does not stay fixed. In response to an applied voltage, charge flows through the resistor, bringing the floating-gate potential to that of the source/drain. After a certain amount of time, the entire voltage $V_{gs}$ is dropped across the ferroelectric 2, and can thus be used to change the polarization state of ferroelectric 2. Unlike previous device designs, the full gate amplitude can be used to write the device.

The time it takes for the floating-gate potential to change depends on intrinsic device characteristics such as the coupling resistance between floating gate 7 and all of the channel, source and drain, the capacitance of the ferroelectric capacitor, and the polarization state of the ferroelectric 2. For the purposes of this discussion, the characteristic time, T, for the floating gate potential to change, is defined as follows: when a voltage $V_{gs}$ is applied to the gate electrode 5, then T is the time it takes for the floating-gate potential to change from its initial value (just after the voltage is applied to the gate) to halfway between its initial value and the source/drain potential ($V_{s/d}$).

For example, information can be written to the device according to the following scenario. First, the source/drain voltage ($V_{s/d}$) is set to zero, and 3 Volts are applied to the gate electrode as $V_{gs}$. Immediately after $V_{gs}$ is applied, the floating-gate voltage ($V_{FG}$) rises to a maximum value (between 0 and 3 V) given by Equation (1). As time passes, $V_{FG}$ decreases toward $V_{s/d}$=0V. We define T as the time required for $V_{FG}$ to decay halfway to $V_{s/d}$. As will be understood, the requirements on T will depend on device application. For DRAM applications, it is desirable to have T on the order of 10 nanoseconds, and generally less than 100 ns. For Flash memory, T can be on the order of 100 ns, and generally less than 1 millisecond. On the other hand, EEPROM devices can be slow, with a T on the order of 1 second, and still be useful.

Reading the information in the inventive cell can be carried out in the following way: When a read voltage pulse is applied to the gate 5, the potential of the floating gate $V_{FG}$ is initially given by Equation (1). As Equation (1) shows, this potential differs depending on the initial polarization state of the ferroelectric 2 (i.e. depending on the information that was stored in the cell). As shown schematically in FIG. 4, if the transistor source and drain have been suitably biased prior to device reading, current $I_d$ will flow through the transistor. The magnitude of the current $I_d$ through the transistor is mainly controlled by the floating gate potential, $V_{FG}$. As described hereinabove, because of the resistive coupling between floating gate 7 and source/drain/channel 3s/3d/3c, the floating-gate potential $V_{FG}$ changes over a characteristic time T. When the floating-gate potential, $V_{FG}$, approaches $V_{s/d}$, the transistor turns off. FIG. 5 illustrates the drop in floating-gate potential after a read pulse. As shown in FIG. 5, the time it takes for the floating-gate potential, $V_{FG}$, to drop is different depending on the polarization state of the ferroelectric. Therefore, the state of the memory cell can be read by measuring how much current flows through the device during a read pulse.

Figure 6:
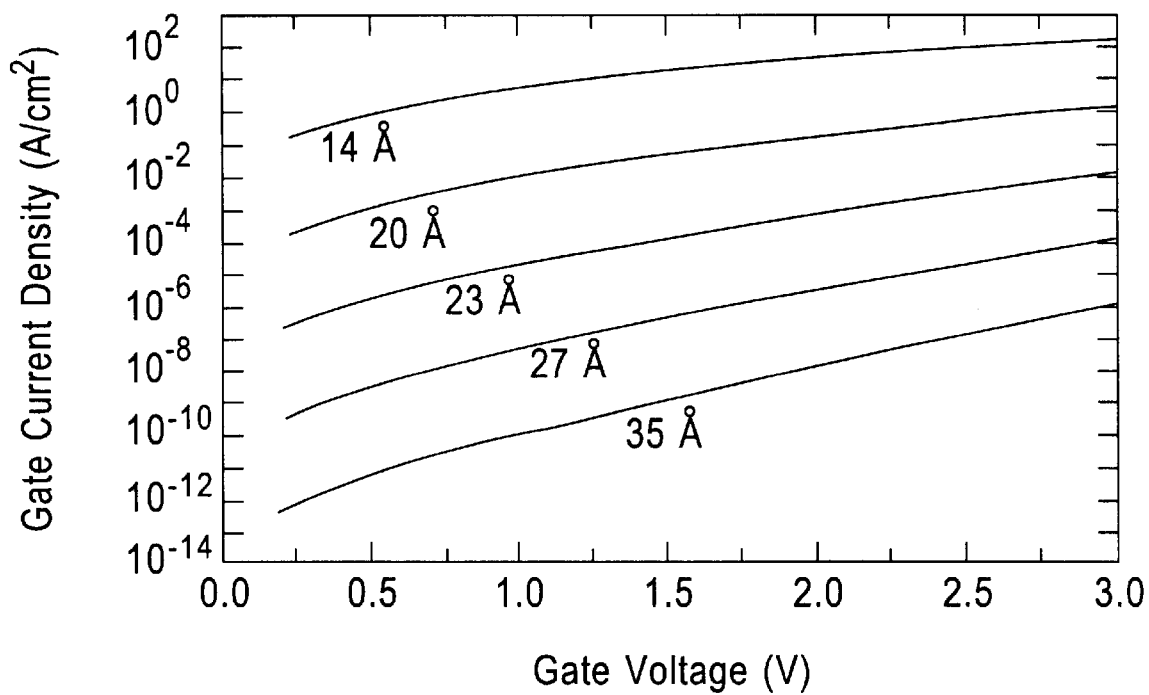
FIG. 6 is a graph (based on Rana et al, Appl. Phys. Lett. 69, 1104, 1996) that illustrates the relationship between current density and gate voltage for $SiO_2$ resistor layers of several thicknesses in FET transistors constructed in accordance with the present invention.

The floating gate 7 is resistively coupled to the transistor channel using either a fabricated resistor, or a very thin $SiO_2$ layer. For $SiO_2$ layers less than 40 Angstroms thick, electrons can move through the insulator via direct quantum mechanical tunneling. This type of tunneling process does not degrade the thin oxide, and therefore does not shorten the device lifetime. FIG. 6 plots current-voltage curves for thin oxide layers (<about 35 Angstroms) as a function of voltage (see Rana et al, supra).

Using these curves to extract oxide resistances per unit area, device switching speeds on the order of 200 ns for a 15 Angstrom oxide, and <20 ns for a 12.5 Angstrom oxide can be calculated. (These numbers are estimated assuming a ferroelectric dielectric constant of 500, and a ferroelectric thickness of 3000 Angstroms.) These device switching speeds are much faster than the speeds of existing non-volatile memories, and can approach DRAM speeds using extremely thin oxides and suitable (low dielectric constant) ferroelectrics such as described in U.S. Pat. No. 5,365,094, supra, and in Rost et al, supra.

Figure 7:
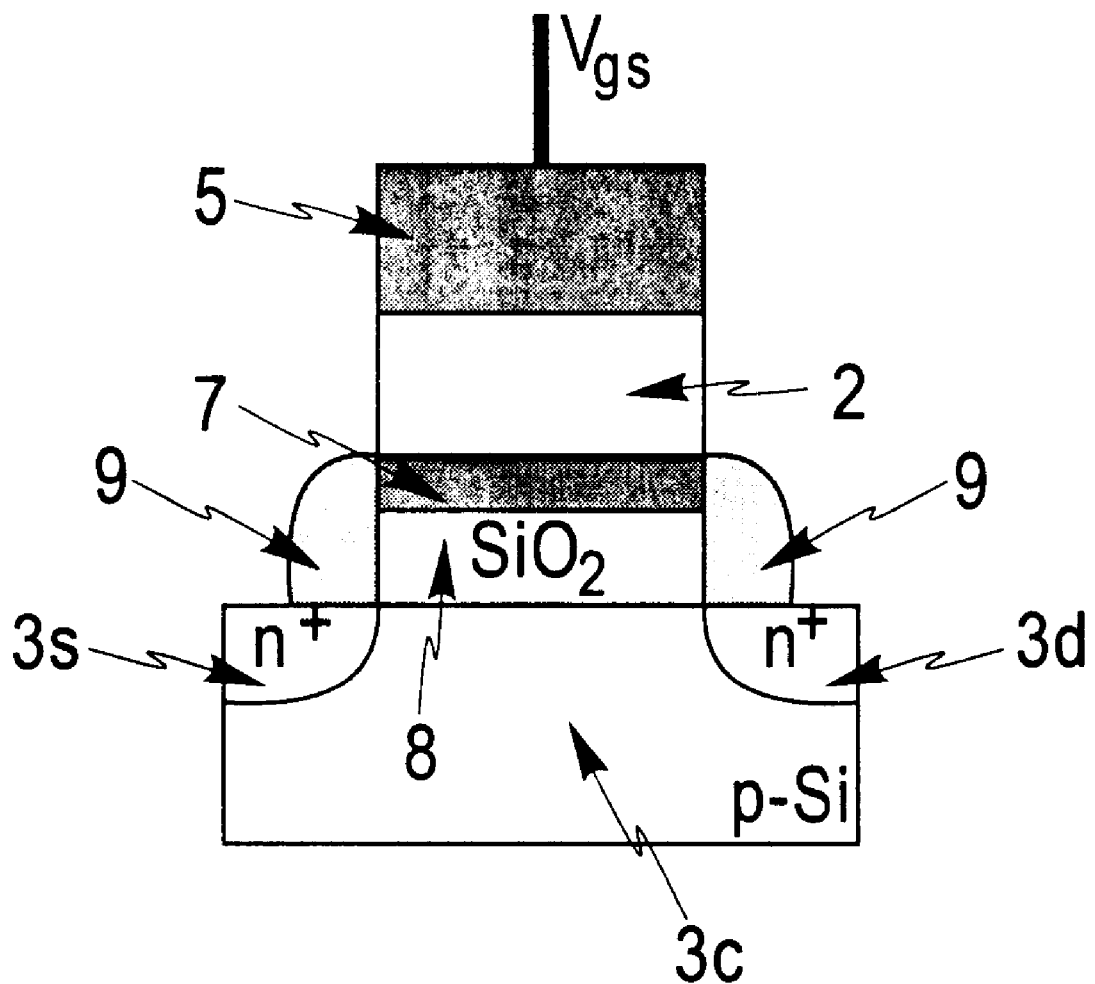
FIG. 7 is a cross-sectional view of a FET transistor constructed in accordance with a second embodiment of the invention, using a fabricated resistor to connect the floating gate to the source and drain regions.

As an alternative to a very thin $SiO_2$ layer for the resistive coupling between gate and channel, the transistor can include a fabricated resistor 9 between floating gate 7 and source 3s (and/or drain 3d) as shown in FIG. 7. Although slightly complicating the fabrication process, this geometry would allow the device to have a slightly thicker $SiO_2$ layer (which would be more robust). It would also allow a finer control of the floating gate coupling resistance.

The ferroelectric memory FET described herein offers significant advantages over existing non-volatile memory technologies, including all other proposed ferroelectric memory transistor designs. Because of the resistive coupling of floating gate to transistor channel, the memory can be both read and written using low voltages, and with speeds approaching that of DRAM. Because the memory cell consists of only a single transistor, memory can be very highly integrated. Finally, this device is attractive from a processing standpoint as well. The ferroelectric material is deposited onto a planar, metallic substrate, which alleviates step coverage and interface issues. Also, the ferroelectric thickness is not a critical device dimension, meaning that the ferroelectric film can be kept relatively thick in order to reduce leakage currents.

Although the invention has been described with reference to an FET transistor for use with nonvolatile memory applications, other applications of the inventive concepts disclosed herein will be apparent to those skilled in the art. Accordingly, it is intended that all such applications of the invention be encompassed by the claims that follow.

What is claimed is:

1. A field effect transistor comprising a source region and a drain region formed in a semiconductor material, a channel region disposed between said source region and said drain region, an insulating layer of electrically insulating material disposed over said channel region, a floating gate layer of electrically conducting material disposed over said insulating layer, a layer of electrically nonconducting ferroelectric material disposed over said floating gate layer, a gate electrode overlying said layer of ferroelectric material, and a fabricated resistor layer resistively coupled to said floating gate layer and at least one member of the group consisting of said source region, said drain region, and said channel region.

2. A field effect transistor as set forth in claim 1, wherein said semiconductor material is silicon and said electrically insulating material is $SiO_2$.

3. A field effect transistor as set forth in claim 1, wherein, when a voltage is applied to said gate electrode then said source region and said drain region are at an initial first potential and said floating gate layer is at an initial second potential, and wherein the time required for said floating gate layer to change its potential from said initial second potential to a value halfway between said first potential and said initial second potential is less than about 1 second.

4. A field effect transistor as set forth in claim 1, wherein, when a voltage is applied to said gate electrode then said source region and said drain region are at an initial first potential and said floating gate layer is at an initial second potential, and wherein the time required for said floating gate layer to change its potential from said initial second potential to a value halfway between said first potential and said initial second potential is less than about 1 millisecond.

5. A field effect transistor as set forth in claim 1, wherein, when a voltage is applied to said gate electrode then said source region and said drain region are at an initial first potential and said floating gate layer is at an initial second potential, and wherein the time required for said floating gate layer to change its potential from said initial second potential to a value halfway between said first potential and said initial second potential is less than about 100 nanoseconds.

6. A field effect transistor as set forth in claim 1, wherein the ferroelectric layer is composed of one of $LiNbO_3$, $BaTiO_3$, $PbTiO_3$, $Bi_3Ti_4O_{12}$, $SrBi_2TaO_9$, $SrBi_2Ta_xNb_{1-x}O_9$, and $PbZr_xTi_{1-x}O_3$.

7. A field effect transistor comprising a source region and a drain region formed in a semiconductor material, a channel region disposed between said source region and said drain region, an insulating layer of electrically insulating material disposed over said channel region, a floating gate layer of electrically conducting material disposed over said insulating layer, a layer of electrically nonconducting ferroelectric material disposed over said floating gate layer, a gate electrode overlying said layer of ferroelectric material, and a fabricated resistor layer composed of doped polysilicon and resistively coupled to said floating gate layer and at least one member of the group consisting of said source region, said drain region, and said channel region.

8. A field effect transistor as set forth in claim 7, wherein said semiconductor material is silicon and said electrically insulating material is $SiO_2$.

9. A field effect transistor as set forth in claim 7, wherein, when a voltage is applied to said gate electrode then said source region and said drain region are at an initial first potential and said floating gate layer is at an initial second potential, and wherein the time required for said floating gate layer to change its potential from said initial second potential to a value halfway between said first potential and said initial second potential is less than about 1 second.

10. A field effect transistor as set forth in claim 7, wherein, when a voltage is applied to said gate electrode then said source region and said drain region are at an initial first potential and said floating gate layer is at an initial second potential, and wherein the time required for said floating gate layer to change its potential from said initial second potential to a value halfway between said first potential and said initial second potential is less than about 1 millisecond.

11. A field effect transistor as set forth in claim 7, wherein, when a voltage is applied to said gate electrode then said source region and said drain region are at an initial first potential and said floating gate layer is at an initial second potential, and wherein the time required for said floating gate layer to change its potential from said initial second potential to a value halfway between said first potential and said initial second potential is less than about 100 nanoseconds.

* * * * *